(12) United States Patent
Lehmann

(10) Patent No.: US 10,126,349 B2
(45) Date of Patent: Nov. 13, 2018

(54) METHOD FOR TESTING A TRANSFORMER

(71) Applicant: CONTINENTAL TEVES AG & CO. OHG, Frankfurt (DE)

(72) Inventor: Sören Lehmann, Frankfurt (DE)

(73) Assignee: Continental Teves AG & Co. oHG, Frankfurt (DE)

(*) Notice: Subject to any disclaimer, the term of this patent is extended or adjusted under 35 U.S.C. 154(b) by 191 days.

(21) Appl. No.: 15/024,429

(22) PCT Filed: Sep. 25, 2014

(86) PCT No.: PCT/EP2014/070563
§ 371 (c)(1),
(2) Date: Mar. 24, 2016

(87) PCT Pub. No.: WO2015/044307
PCT Pub. Date: Apr. 2, 2015

(65) Prior Publication Data
US 2016/0209457 A1 Jul. 21, 2016

(30) Foreign Application Priority Data
Sep. 27, 2013 (DE) .......... 10 2013 219 657

(51) Int. Cl.
*G01R 31/02* (2006.01)
*G01D 5/20* (2006.01)
(Continued)

(52) U.S. Cl.
CPC ............ *G01R 31/027* (2013.01); *G01D 5/20* (2013.01); *G01D 18/00* (2013.01); *G01R 31/2829* (2013.01)

(58) Field of Classification Search
None
See application file for complete search history.

(56) References Cited

U.S. PATENT DOCUMENTS

| 4,774,465 A | 9/1988 | Nilius |
| 5,654,644 A * | 8/1997 | Zydek ............ B60T 8/885 |
| | | 324/545 |

(Continued)

FOREIGN PATENT DOCUMENTS

| CN | 101346607 A | 1/2009 |
| DE | 4221196 | 1/1994 |

(Continued)

OTHER PUBLICATIONS

German Search Report for German Application No. 10 2013 219 657.1 dated Mar. 24, 2014, including partial translation.

(Continued)

*Primary Examiner* — Melissa Koval
*Assistant Examiner* — Courtney McDonnough
(74) *Attorney, Agent, or Firm* — RatnerPrestia

(57) ABSTRACT

A method for testing a transformer including a first inductance and a second inductance, which is galvanically isolated from the first inductance, the inductances being connected in a first circuit and in a second circuit, correspondingly, the method comprising: —applying a DC voltage between a first circuit point and a second circuit point in the first circuit; —tapping off a test voltage between two circuit points in the first or second circuit, wherein one of the two circuit points is different than the first circuit point and the second circuit point; and —testing the transformer on the basis of a comparison between the DC voltage and the test voltage.

12 Claims, 9 Drawing Sheets

(51) Int. Cl.
*G01D 18/00* (2006.01)
*G01R 31/28* (2006.01)

(56) References Cited

U.S. PATENT DOCUMENTS

| | | | |
|---|---|---|---|
| 7,034,547 B2 | 4/2006 | Ryder | |
| 2007/0146942 A1* | 6/2007 | Covington | ............... G01D 3/08 |
| | | | 361/38 |

FOREIGN PATENT DOCUMENTS

| | | |
|---|---|---|
| DE | 4425903 | 1/1996 |
| DE | 29721675 | 3/1998 |
| DE | 10347979 | 5/2005 |
| DE | 102009008465 | 8/2010 |
| EP | 0238922 | 9/1987 |
| EP | 0569924 | 11/1993 |
| FR | 2848300 A1 | 6/2004 |
| WO | 2007089372 A2 | 8/2007 |
| YU | 17702 | 12/2004 |

OTHER PUBLICATIONS

International Search Report for International Application No. PCT/EP2014/070563 dated Jan. 23, 2015.
Written Opinion of the International Searching Authority for International Application No. PCT/EP2014/070563 dated Jan. 23, 2015.
Chinese Office Action for Chinese Application No. 201480053090.9, dated Jan. 3, 2017, including English translation, 15 pages.
European Search Report for European Application No. 14 777 294.1, dated Jul. 4, 2018, 5 pages.

* cited by examiner

METHOD FOR TESTING A TRANSFORMER

CROSS REFERENCE TO RELATED APPLICATIONS

This application is the U.S. National Phase Application of PCT International Application No. PCT/EP2014/070563, filed Sep. 25, 2014, which claims priority to German Patent Application No. DE 10 2013 219 657.1, filed Sep. 27, 2013, the contents of such applications being incorporated by reference.

FIELD OF THE INVENTION

The invention relates to a method for testing a transformer, to a control device for carrying out the method and to the transformer.

BACKGROUND OF THE INVENTION

DE 44 259 03 C3, which is incorporated by reference and EP 238 922 B1, which is incorporated by reference disclose transformers which operate as position sensors according to the principle of linear travel measurement on the basis of permanent-magnetic linear contactless displacement, referred to as PLCD. Such position sensors are also known as linear inductive position sensors, referred to as LIPS.

SUMMARY OF THE INVENTION

An aspect of the invention improves transformers generally.

According to one aspect of the invention, a method for testing a transformer with a first inductor and a second inductor galvanically isolated from the first inductor, which inductors are correspondingly connected in a first circuit and in a second circuit comprises the steps of applying a direct voltage between a first circuit point and a second circuit point in the first circuit point; tapping a test voltage between two circuit points in the first or second circuit, wherein one of the two circuit points is different from the first circuit point and the second circuit point and testing the transformer on the basis of a comparison of the direct voltage and the test voltage.

The specified method is based on the idea that a transformer with two galvanically isolated inductors can only be operated with an alternating voltage for physical reasons, since direct voltages cannot be transmitted between the inductors as a result of the galvanic isolation. The specified method comes in here with the realization that a direct voltage which is applied to the inductors must not have any effect on the function of the transformer of transmitting an alternating voltage between the two inductors.

On the other hand, a direct voltage which is applied to one of the two inductors gives rise to expected direct voltage potentials at certain circuit points in the corresponding circuit of this inductor. Therefore, the circuit points can be monitored for the expected direct voltage potentials.

If, for example, the two inductors are galvanically connected owing to a short-circuit, the direct voltage potential at the monitored switching point would differ from the expected direct voltage potential, with the result that the fault can be unambiguously detected.

In this context switching points are to be understood below as meaning points in the first or second circuit which differ in their electrical potential when an electrical voltage is applied to these circuits.

In one development of the specified method, during the testing of the transformer a fault is detected if a detected transmission behavior between the test voltage and the direct voltage differs from a predetermined transmission behavior between the test voltage and the direct voltage during fault-free operation of the transformer. As a result of the monitoring of the transmission behavior, the above-mentioned, expected direct voltage potential is not fixed to a specific value and can therefore be verified even if the direct voltage changes owing to temperature or ageing.

In principle, the method can be carried out in a desired way with respect to the application of the direct voltage and the tapping of the test voltage, wherein the direct voltage is applied, for example, to the first inductors of the transformer, and the test voltage is tapped at the second inductor of the transformer. In particular, in the event of the specified method being applied in a transformer which is used as a position sensor, the application of the direct voltage and the tapping of the test voltage on the side of the first coil is particularly favorable if the first coil is used as a secondary coil. In this way, it is possible to determine not only short circuits to the primary coil but also to further secondary coils which are necessary in linear position sensors in order to generate linear output signals with alternating voltages from the position to be determined.

In one particular development of the specified method, the first inductor in the first circuit is additionally part of a test circuit which predefines the transmission behavior and has at least one resistor which connects the first inductor to a fixed potential by means of the direct voltage, wherein the direct voltage and the test voltage are correspondingly applied to the test circuit and tapped in the test circuit. This development is based on the idea that the inductors can, from the point of view of direct voltage, constitute short-circuits, and when further resistors are absent they can bring about very high direct currents if the direct voltage is applied. Therefore, within the scope of the particular development it is proposed to connect the first inductor to a predetermined potential via a resistor, such as for example a division resistor on the basis of the direct voltage, and to keep the direct currents through the first inductor as small as possible.

According to a further aspect of the invention, an execution device is configured to carry out one of the specified methods.

In one development of the specified execution device, the specified execution device has a memory and a processor. In this context, one of the specified methods is stored in the form of a computer program in the memory, and the processor is provided for executing the method when the computer program is loaded from the memory into the processor.

According to a further aspect of the invention, a computer program comprises program code means for carrying out all the steps of one of the specified methods if the computer program is executed on the computer or one of the specified devices.

According to a further aspect of the invention, a computer program product contains a program code which is stored on the computer-readable data carrier and which, when executed on a data-processing device, carries out one of the specified methods.

According to a further aspect of the invention, a transformer comprises a first circuit with a first inductor, a second circuit with a second inductor which is galvanically isolated from the first inductor and is coupled to the first inductor, and one of the specified execution devices.

In one development, the specified transformer comprises a test circuit which contains the first inductor and has at least two resistors for applying the direct voltage and tapping the test voltage, wherein the test circuit has a means for galvanically decoupling from the ground connection, in particular via a capacitor. The second resistor is, in addition to the first resistor mentioned above, optional and can also be omitted for the implementation of the present development. As a result of the galvanic isolation from the ground connection, the test circuit is grounded from the point of view of the alternating voltage, with the result that from the point of view of the alternating voltage only the first circuit, but not the test circuit, is present.

If the galvanic isolation is a capacitor, the method which is mentioned at the beginning should be carried out in the execution device if alternating voltages with high frequencies, for example in or above the kHz range, are transmitted with the transformer. In this way, a small capacitance can be selected for the capacitor, with the result that the reactive resistance of the capacitor can be ignored.

In an additional development of the specified transformer, the resistors form a voltage divider, wherein the first inductor is connected in series between the two resistors. In this way, the transmission behavior mentioned above can be determined by suitable dimensioning of the two resistors, and according to the abovementioned condition that the test voltage is to be tapped at least one switching point at which the direct voltage is not applied, there is a third switching point which differs clearly from the other switching points and at which the test voltage can be tapped.

In one particular development of the specified transformer, a first of the two resistors is arranged opposite the ground connection when viewed from the first inductor, and a transformer tap is arranged between the first resistor and the first inductor. In this way, the input resistor or output resistor of the transformer can be influenced at the same time as the first resistor, in order to exchange in an optimum way a signal which is present at the transformer (and which is fed to or away from the transformer) using a circuit which is connected to the transformer.

For this purpose, the first resistor preferably has high impedance. The expression high impedance refers to the previously mentioned input resistance or output resistance of electronic components, switching devices or measuring devices, that is to say in this case of the transformer. It states that the resistance of the transformer when viewed from a circuit connected to the transformer exceeds a particular resistance value. As a rule, the term high impedance is used if the resistance exceeds a two-digit kilo-ohm value, that is to say it lies above 10 kilo-ohms. The high impedance is unlimited upwardly.

In one particularly preferred development of the specified method, a second of the two resistors is connected in series with a voltage source in order to output the direct voltage parallel with the capacitor. Therefore, with this second resistor it is possible to apply the abovementioned fixed potential to the first inductor of the transformer, in order to monitor the transformer in a particularly advantageous inventive fashion for short-circuits and interruptions using the direct voltage.

BRIEF DESCRIPTION OF DRAWINGS

The properties, features and advantages of this invention which are described above as well as the way in which they are achieved become clearer and more clearly comprehensible in conjunction with the following description of the exemplary embodiments which are explained in more detail in conjunction with the drawings, wherein.

DETAILED DESCRIPTION OF THE PREFERRED EMBODIMENTS

In the figures, identical technical elements are provided with the same reference symbols and are described only once.

Figure 1:
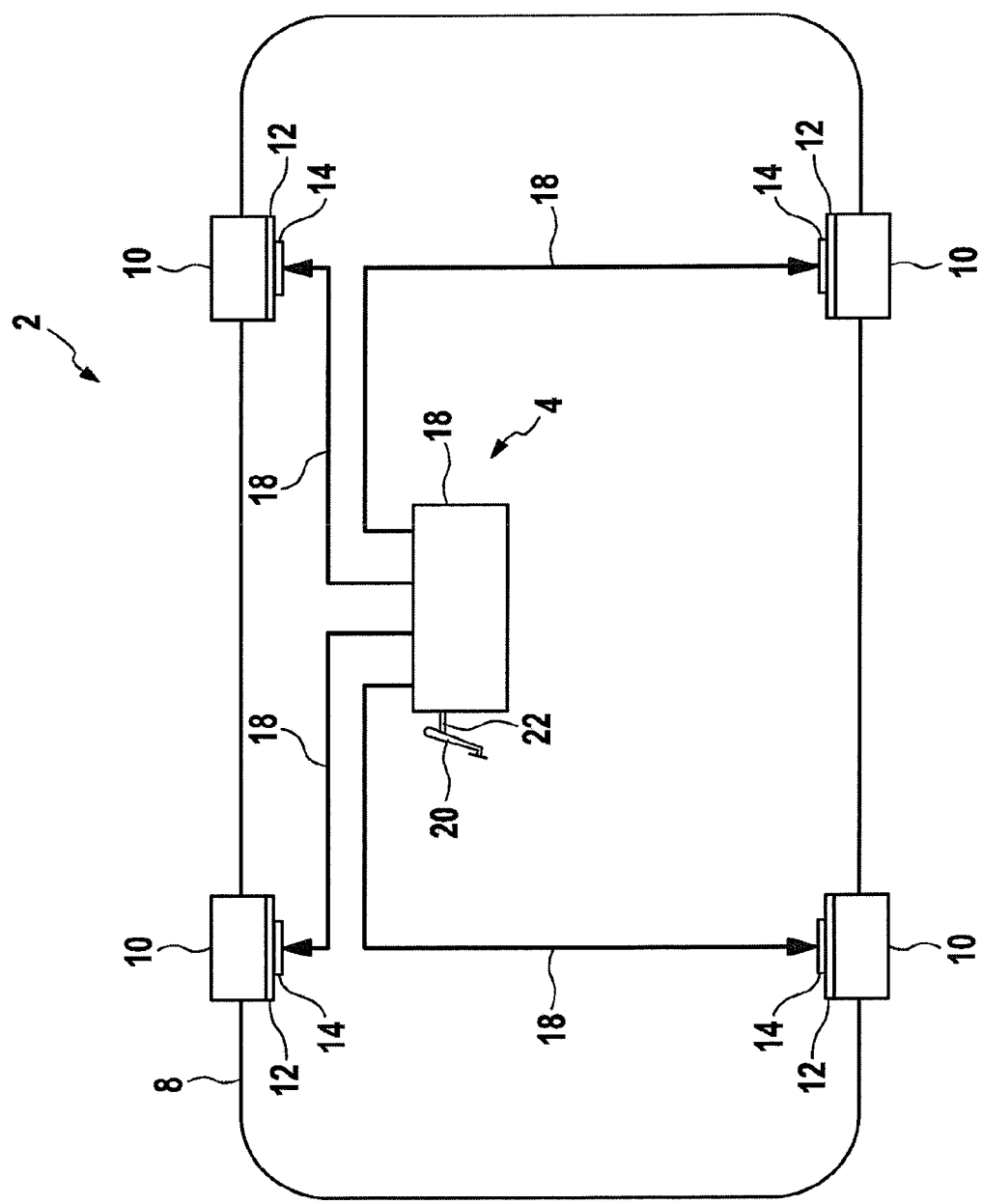
FIG. 1 shows a perspective view of a tandem master cylinder with a travel sensor.

Reference is made to FIG. 1 which shows a basic illustration of a vehicle 2 with a service brake 4 and a parking brake.

The vehicle 2 has a chassis 8 which can roll on four wheels 10 on a road (not illustrated further), driven by means of an engine (not illustrated further). In the present embodiment, brake disks 12 are attached in a rotationally fixed fashion to the individual wheels 10, on which brake disks 12 brake effectors, which are to be described below and which are attached in a rotationally fixed fashion to the chassis 8, can engage, in order to lock the wheels 10 in a manner known per se and to brake the vehicle 2 from travel or to secure it in the stationary state.

In the present embodiment, the service brake 4 has in each case a service brake effector 14, such as, for example, a brake shoe, on each wheel 10. These service brake effectors 14 are actuated by a tandem master cylinder 16 via hydraulic lines 18 on the basis of a service brake request 22, predefinable with a brake pedal 20, in a way which is known per se.

The invention will be explained in more detail below on the basis of a travel sensor 25 which is used in the tandem master cylinder 16 and has a transformer. At this point it is to be noted that the explanation below is purely by way of example and that the invention can be applied to any transformers.

Figure 2:
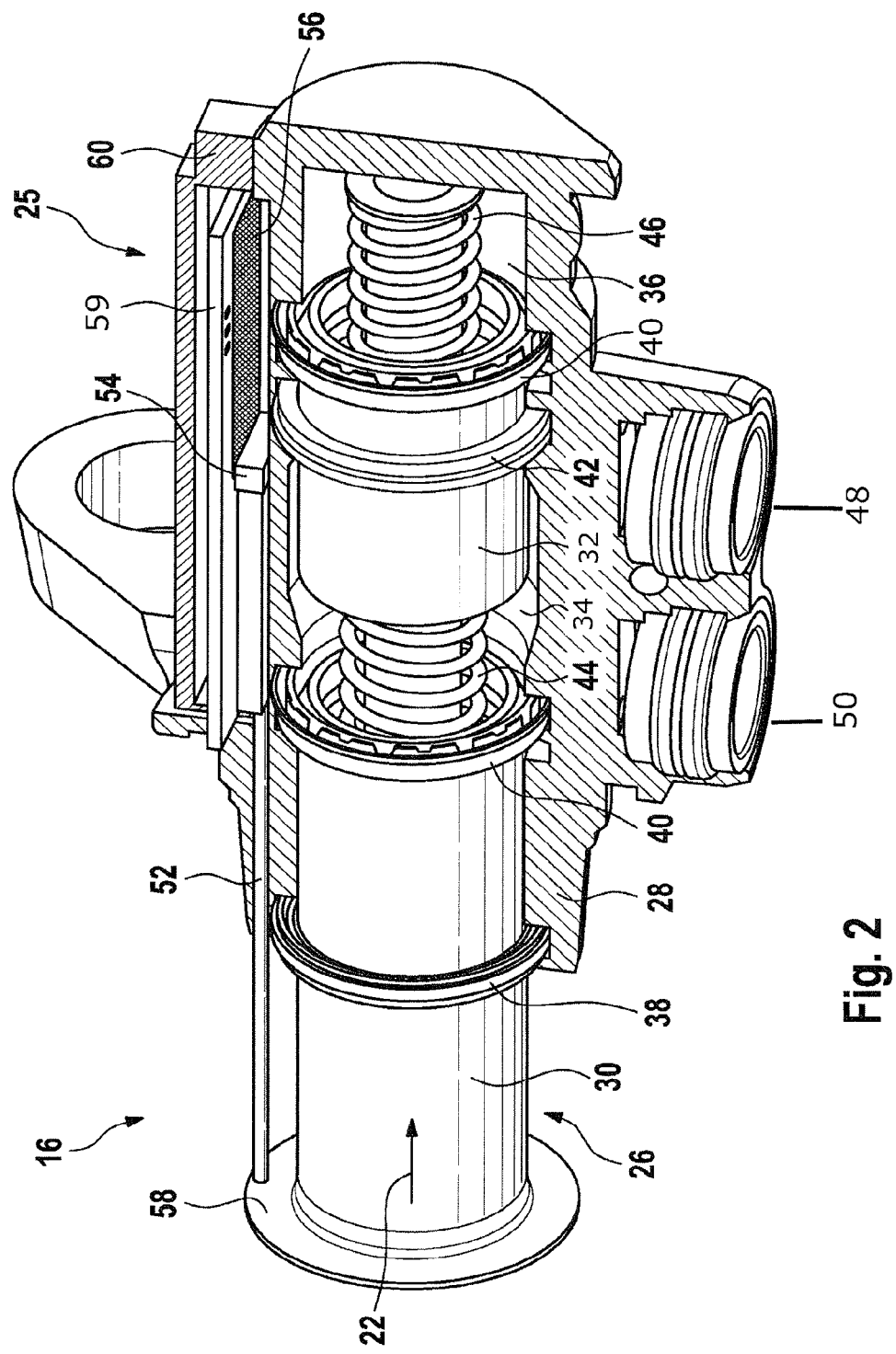
FIG. 2 shows a lateral sectional view of the travel sensor from FIG. 1.

Reference is made to FIG. 2, which shows the tandem master cylinder 16 with a travel sensor 25.

The tandem master cylinder 16 also has a pressure piston 26, of the service brake request 22 is movably arranged in a housing 28, wherein the pressure piston 26 is connected to the brake pedal 20 from FIG. 1 in a way which is not illustrated in more detail. The pressure piston 26 itself is divided into a primary piston 30 and a secondary piston 32, wherein the primary piston 30 closes off an inlet of the housing 28, and the secondary piston 32 divides the interior of the housing 28 into a primary chamber 34 and a secondary chamber 36. At the primary piston 30 a secondary collar 38, which separates the interior of the housing 28 from the surrounding air, is arranged in the region of the inlet of the housing 28. Looking into the interior of the housing 28, the secondary collar 38 is followed by a primary collar 40, which seals the gap between the primary piston 30 and a wall of the housing 28. A pressure collar 42 on the secondary piston 32 separates the pressure of the primary chamber 34 from the pressure of the secondary chamber 36. In addition, a further primary collar 40 on the secondary piston 32 seals a gap between the secondary piston 32 and the wall of the housing 28. The primary piston 30 is supported against the secondary piston 32 via a first spring 44, while the secondary piston 32 is supported against a housing floor via a second spring 46. Correspondingly, the primary chamber 34 and the secondary chamber 36 can be supplied with a hydraulic fluid (not shown) via a first and second port 48, 50.

Since a person skilled in the art is aware of the method for functioning of a tandem master cylinder, a detailed description thereof will not be given.

The travel sensor 25 has a sample body in the form of a slide 52 with an encoder magnet 54 at its head end, which encoder magnet 54 can be slid, viewed in the plane of the image, under a sensor circuit 56 which will be described below. For the sliding of the slide 52, the primary piston 30 has a flange 58, which is a counter bearing for the slide 52. The flange 58 and the primary piston 30 therefore together form a measuring object whose position is determined by the sensor circuit 56, to be described below, of the travel sensor 25. The sensor circuit 56 is composed of a plurality of conductor tracks on a wiring carrier 59, such as a lead frame, printed circuit board or some other substrate. A cover 60 can be fitted onto the wiring carrier 59 with the sensor circuit 56 in order to protect, for example, against dirt.

Figure 3:
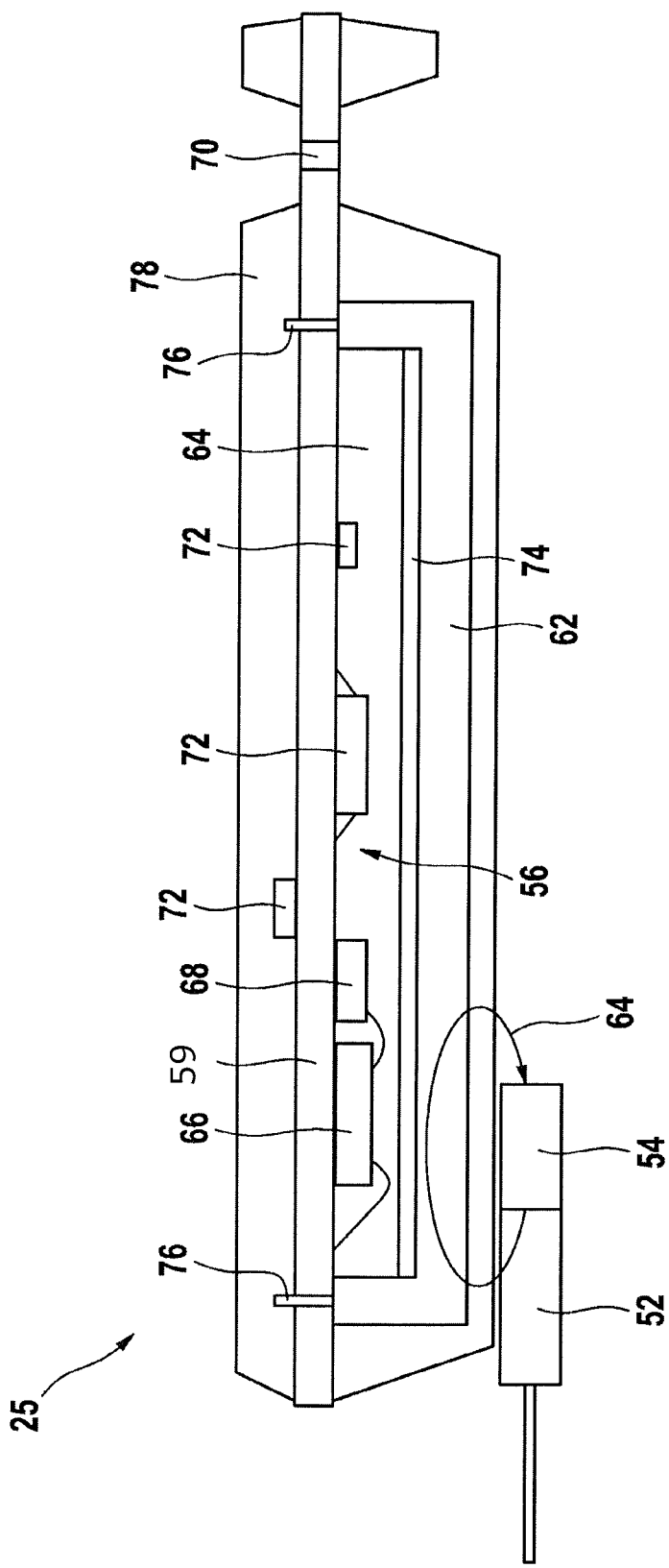
FIG. 3 shows a perspective view of part of the travel sensor from FIG. 2.

Reference is made to FIG. 3, which shows the travel sensor 25 from FIG. 2.

The sensor circuit 56 of the travel sensor comprises a transformer 62. The transformer 62 senses a magnetic field 64 of the encoder magnet 37 and on the basis thereof outputs an electrical encoder signal (not referenced in more detail) to the sensor circuit 56. This encoder signal is converted by a first signal processing chip 66 and a second signal processing chip 68 into a measurement signal (not referenced in more detail) from which the position of the slide 52 and therefore the position of the flange 58 and of the primary piston 30 become apparent. The measurement signal which is generated in this way can finally be tapped at a transmission interface 70 of the travel sensor 25 via a cable (not illustrated further) and can be passed on to a higher signal processing unit (not illustrated further) such as, for example, an engine controller in a vehicle (not illustrated further).

The sensor circuit 56 can comprise protection elements 72 for protecting the two signal processing chips 66, 68, for example against overvoltage. In addition, a screening plate 74, which screens electromagnetic fields between the sensor circuit 56 and the transformer 62 and thereby avoids the circuit 56 influencing the transformer 62, can be arranged between the sensor circuit 56 and the transformer 62.

In the present embodiment, the transformer 62 is arranged in a defined position on the wiring carrier 59 by means of a form closure 76. In this context, a protective material 78 surrounds the wiring carrier 59 and the transformer 62.

Figure 4:
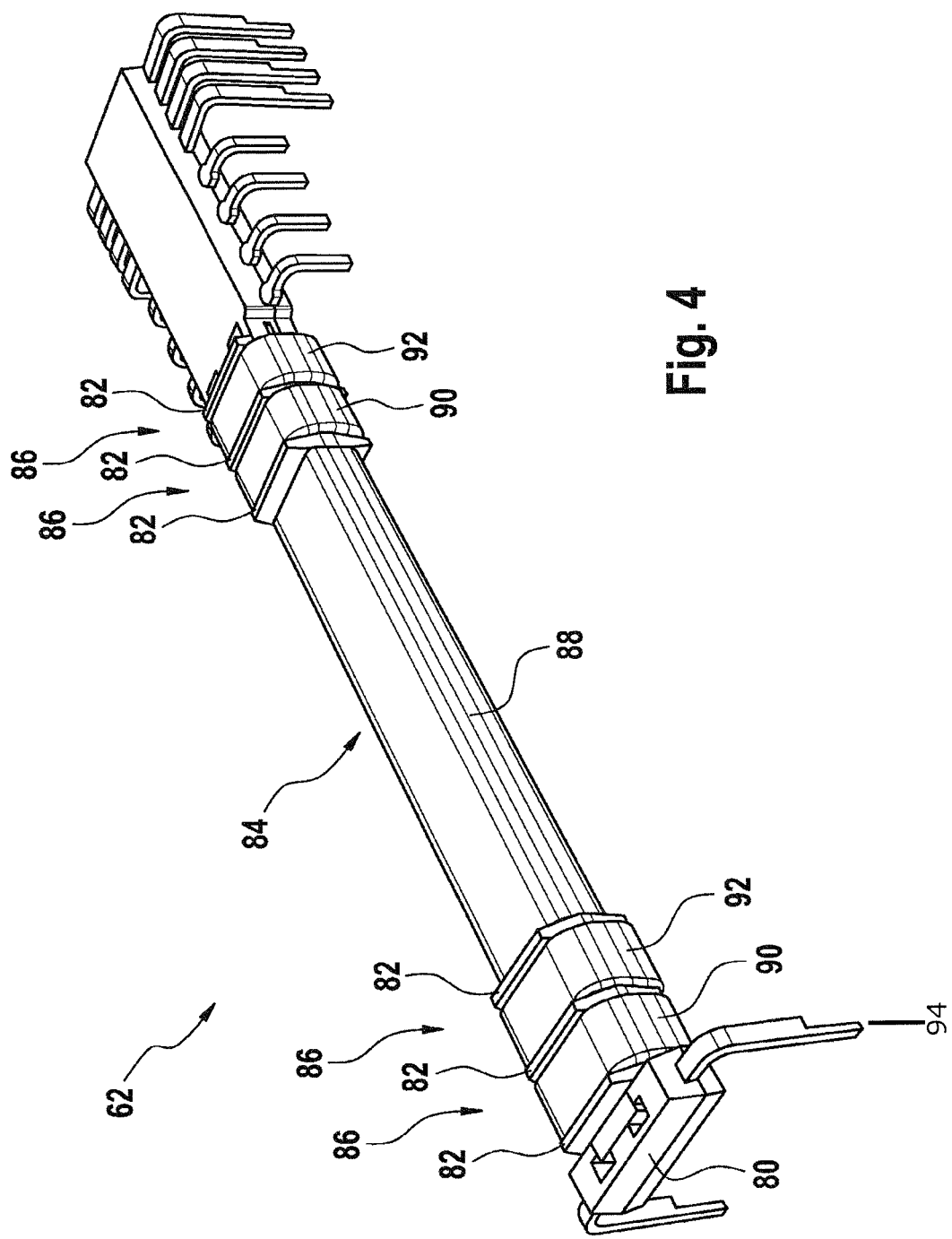
FIG. 4 shows a perspective view of the travel sensor from FIG. 3.

FIG. 4 illustrates a perspective view of the transformer 62. The transformer 62 comprises a coil carrier 80 with a winding space which is divided by means of six webs 82 into a central section 84 and four side sections 86. The coil carrier 80 carries a primary coil 88 which extends along a core (not shown further in FIG. 4) which is assumed to have a single layer in the present case. On the two edge zones of the primary coil 88 lying opposite one another, the coil carrier 80 carries first secondary coils 90 and second secondary coils 92 which are tightly wound and have the purpose of measuring an induction voltage, wherein in this case a first secondary coil 90 and a second secondary coil 92 are arranged in pairs at the two ends of the primary coil 88.

The coils 88, 90, 92 can be placed in electrical contact with the sensor circuit 56 on the wiring carrier 59 via terminal pins 94.

The travel sensor 25 with a transformer such as the transformer 62 is normally referred to as a differential transformer travel sensor. Alternatively, the travel sensor 25 can, however, also be constructed with in each case only one secondary coil at the ends of the primary coil, in respect of which reference is made, for example, to document DE 44 259 03 C3 and EP 238 922 B1.

The function of the travel sensor 25 will firstly be explained with reference to the circuit diagram illustrated in FIG. 5.

In order to operate the travel sensor 25, a series circuit of an electrical input alternating voltage source 96 and two input direct voltage sources 98 which are connected in antipodal fashion with respect to one another are connected to the primary coil of the transformer 62. The input direct voltage sources 98 connect a same potential 102 to the winding ends of the primary coil 88 via input resistors 100 and ensure that the direct current cannot flow through the primary coil 88 but instead the primary coil 88 is connected to a defined, fixed and low-impedance direct potential.

In this context, an alternating voltage (not referenced further) of the input alternating voltage source 96 is transmitted in the transformer 62 of the travel sensor 25 from the primary coil 88 to the secondary coils 90, 92.

In the transformer 62 of the travel sensor 25, the primary coil 88 is connected in the same direction to the first secondary coils 90, which means that the windings of the primary coil 88 and of the first secondary coils 90 are wound in the same direction. In contrast, the primary coil 88 and the secondary coils 92 are connected in opposite directions, which means that the windings of the primary coil 88 and of the second secondary coils 92 are wound in opposite directions.

The first secondary coils 90 are connected on the one hand to a ground connection 106 via a first grounding capacitor 104, that is to say are connected to a fixedly defined potential, while the second secondary coils are also connected to the ground connection 106 via a second grounding capacitor 104. On the other hand, the first and second secondary coils 90, 92 are connected to amplifiers 108, at the outputs (not referenced further) of which a transmitted alternating voltage can be tapped with respect to the ground connection 106, which ground connection 106 constitutes the alternating voltage which is fed into the primary coil 88 and transmitted to the secondary coils 90, 92.

During the operation of the travel sensor 62, the encoder magnet 54 which is shown in FIGS. 2 and 3 is moved along the coils 88, 90, 92 by the slide 52, as a result of which a coupling factor between the coils 88, 90, 92 changes in a manner known per se. In the case of a predetermined alternating voltage which is output by the input alternating voltage source 96, in this way the transmitted alternating voltage at the output of the amplifiers changes, with the result that a change in position of the encoder magnet 54, and therefore of the slide 52, can be detected on the basis of the change in the transmitted alternating voltage. Details of the method of functioning of linear position sensors can be obtained, for example, from the documents mentioned above.

However, a precondition of this is that the transformer is free of galvanic connections between the primary coil 88, the first secondary coils 90 and the second secondary coils 92. In particular, there should also be no interruptions present on the secondary side of the transformer 62 in the circuit diagram in FIG. 5. Within the scope of the present embodiment, this is to be monitored with a reference direct voltage source 110 which is connected on the secondary side to the transformer 62 and which outputs a reference direct voltage 112. Each of the secondary coils 90, 92 is connected in the present embodiment to a center tap 114 of a voltage divider between a first voltage divider resistor 116 and a second voltage divider resistor 118, wherein the first secondary coils 90 and the second secondary coils 92 each divide a first voltage divider resistors 116. The reference direct voltage source 110 is connected here in parallel with the voltage dividers 116, 118.

Figure 5:
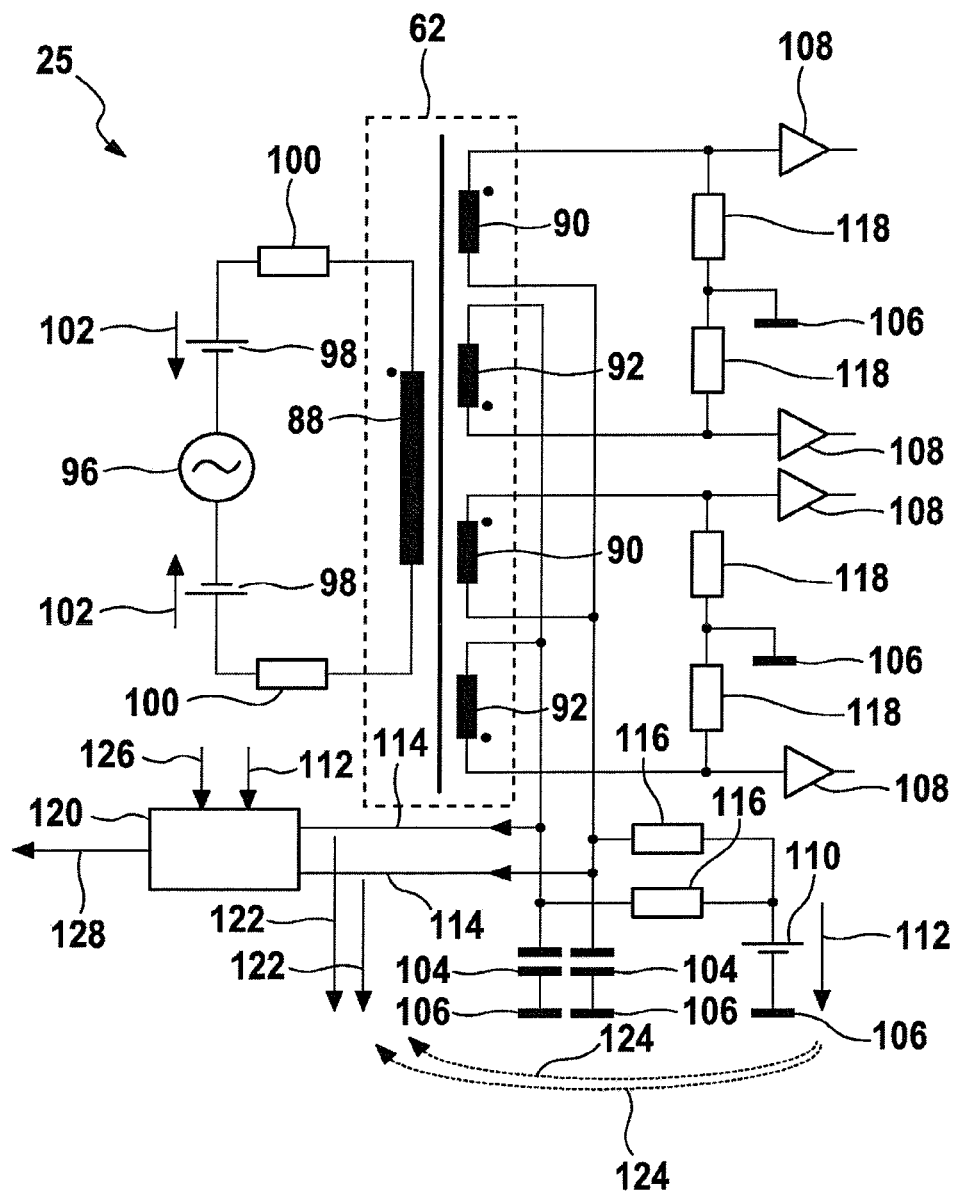
FIG. 5 shows a direct voltage equivalent circuit of the circuit from FIG. 4.

In the present embodiment, a monitoring or test device 120, which carries out a testing or monitoring method in order to monitor the circuit illustrated in FIG. 5 for galvanic interruptions or unintended connections, is connected to the center taps 114.

For this purpose, the test device 120 taps in each case a test direct voltage 122 at the center taps 114, said test direct voltage 122 constituting the electrical direct voltage potential at the center taps 114, for example with respect to the ground connection 106. Each test direct voltage 122 is dependent, with a transmission ratio 124 indicated in FIG. 5, on the reference direct voltage 112. This dependence is determined here for the case in which the circuit shown in FIG. 5 does not have any faults in the form of galvanic interruptions and unintended galvanic connections, by means of the respective voltage dividers and, in this context, in particular by means of the individual voltage divider resistors 116, 118.

In order to monitor the circuit which is illustrated in FIG. 5, the test device 120 can therefore receive not only the test direct voltages 124 but also the reference direct voltage 112 and a predetermined transmission ratio 126. On the basis of the predetermined transmission ratio 126 and the reference direct voltage 112, the test device 120 can determine a test direct voltage (not illustrated further in FIG. 5) for the fault-free case and verify whether the measured test direct voltages 122 correspond to this test direct voltage for the fault-free case. In the event of a fault, that is to say if a measured test direct voltage 122 differs from the test direct voltage for the fault-free case, the test device 120 can output a fault signal 128 with which, for example, a warning message can be output in the vehicle 2.

Figure 6:
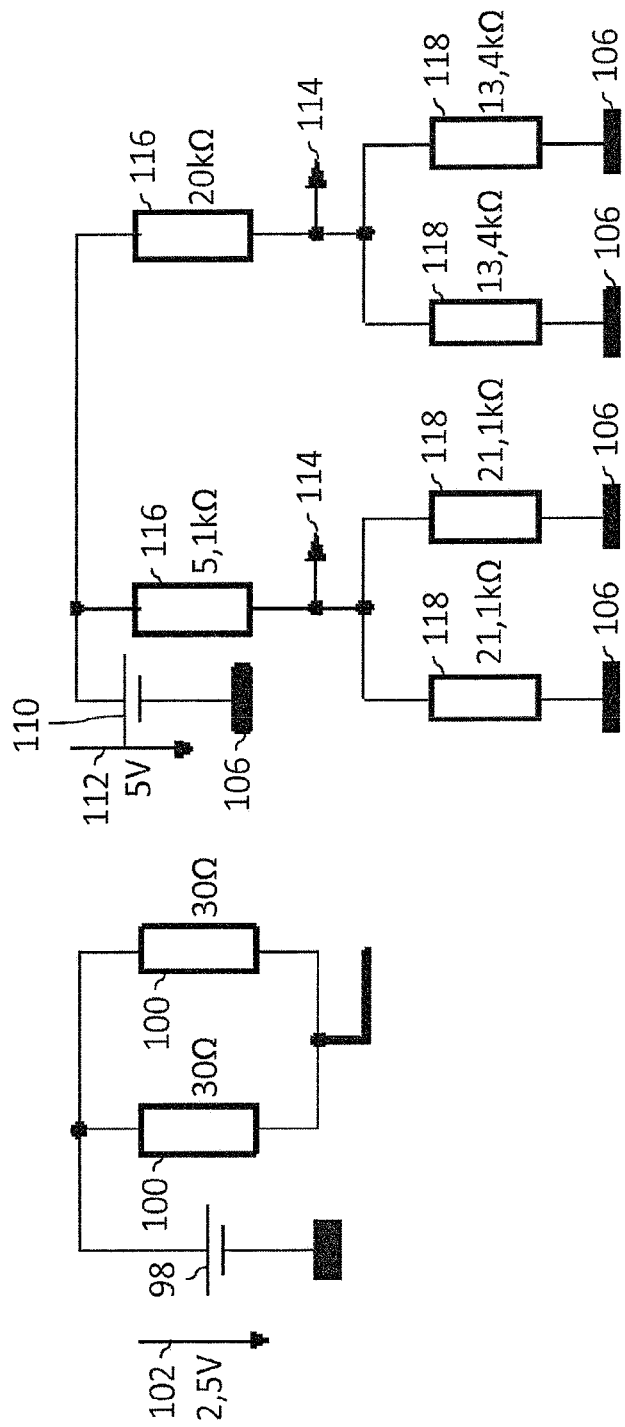
FIG. 6 shows a direct voltage equivalent circuit of the circuit from FIG. 4 in a first fault situation.
Figure 7:
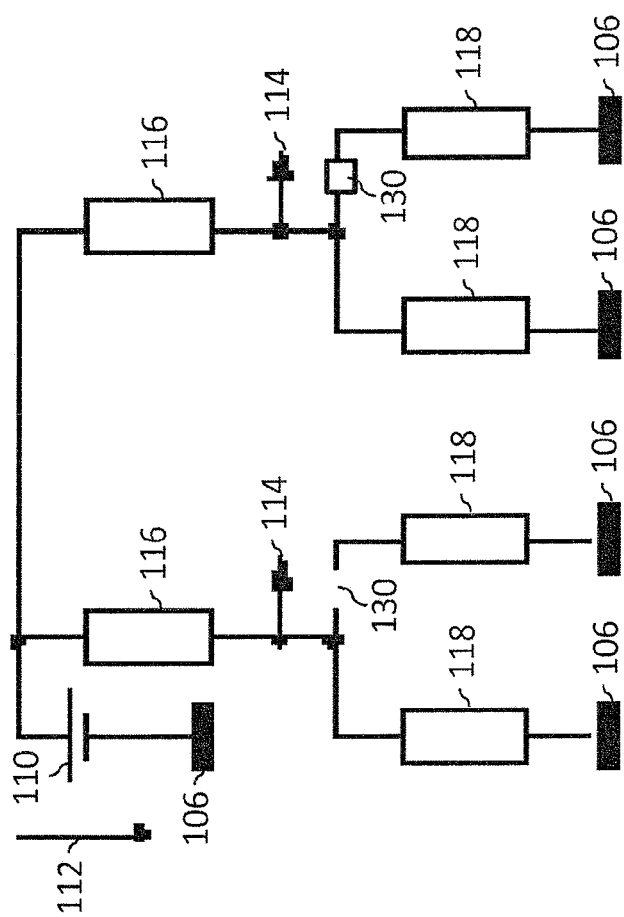
FIG. 7 shows a direct voltage equivalent circuit of the circuit from FIG. 4 in a second fault situation.
Figure 8:
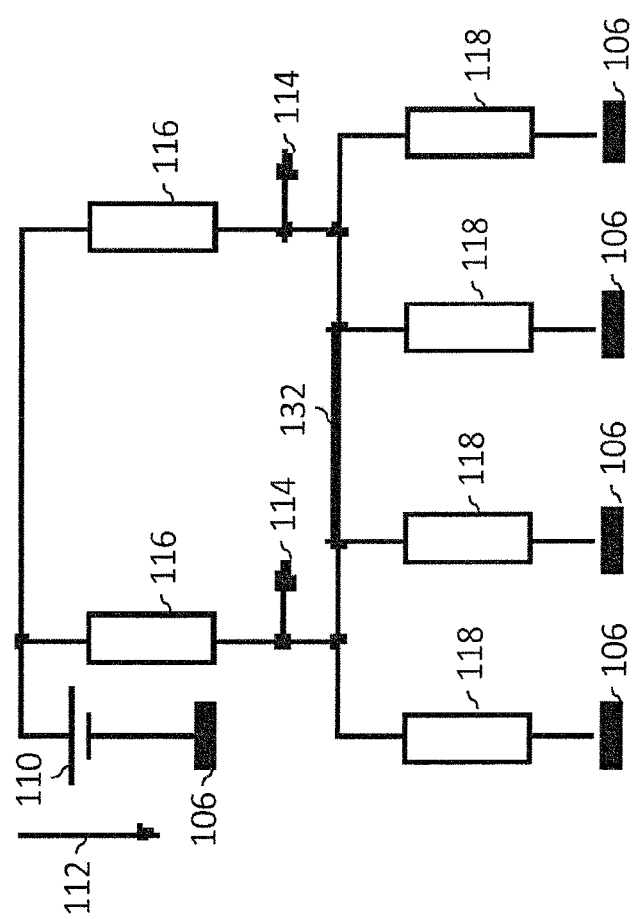
FIG. 8 shows a direct voltage equivalent circuit of the circuit from FIG. 4 in a third fault situation.
Figure 9:
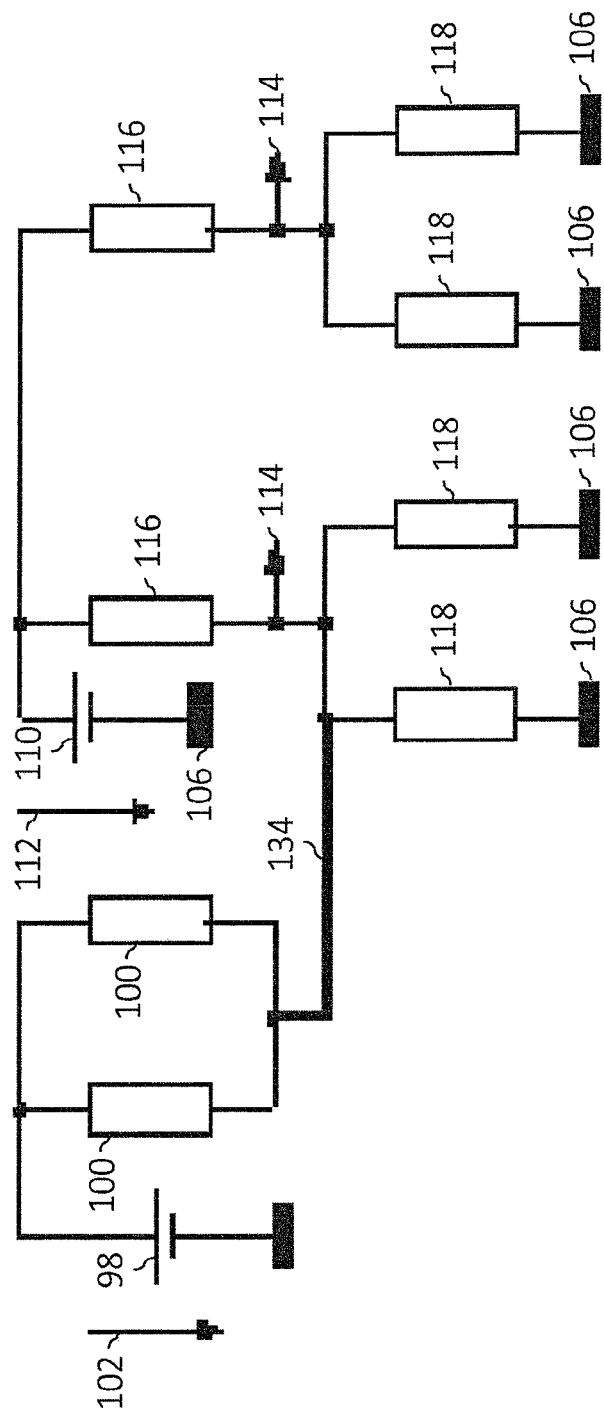
FIG. 9 shows a direct voltage equivalent circuit of the circuit from FIG. 4 in a fourth fault situation.

FIG. 6 illustrates the circuit from FIG. 5 as a direct current equivalent circuit diagram in a fault-free state with dimensioned values for the direct current components of the circuit. In contrast, FIGS. 7 to 9 illustrate various fault scenarios for the circuit from FIG. 5. In this context, in FIG. 7 a galvanic interruption 130 in one of the secondary coils 90, 92, in FIG. 8 a galvanic connection 132 between the first and second secondary coils 90, 92, referred to below as secondary side short-circuit 132, and in FIG. 9 a galvanic connection 134 between the primary coil 88 and one of the secondary coils 90, 92, referred to below as transformer short-circuit 134, should be assumed as fault scenarios.

The values shown in FIG. 6 for the direct current equivalent circuit diagram of the circuit from FIG. 5 are obtained for the test direct voltage 122 at the center tap 114 for the scenario values shown in FIGS. 6 to 9 according to the following table:

| Scenario | First test voltage 122 | Second test voltage 122 |
| --- | --- | --- |
| FIG. 6 | 3.37 V | 1.26 V |
| FIG. 7 | 4.03 V | 2.00 V |
| FIG. 8 | 2.51 V | 2.51 V |
| FIG. 9 | 2.50 V | 2.50 V |

As is apparent from the table, the test voltages 122 change with respect to the normal case from FIG. 6. Instead, if appropriate even the fault could be qualified and specified, in order, for example, to determine the effected coil of the transformer 62 and, if appropriate, replace it.

As is apparent, in particular from a comparison of the test voltages 122 in FIGS. 8 and 9, the resistors should have the closest possible tolerances in order to ensure reliable evaluation, because the test voltages 122 for the various fault cases can be very close to one another.

The invention claimed is:

1. A method for testing a transformer with a first inductor and a second inductor galvanically isolated from the first inductor, which inductors are correspondingly connected in a first circuit and in a second circuit, the method comprising:
    applying a direct voltage between a first circuit point and a second circuit point in the first circuit;
    tapping a test voltage between two circuit points in the first or second circuit, wherein one of the two circuit points is different from the first circuit point and the second circuit point; and
    testing the transformer on the basis of a comparison of the direct voltage and the test voltage using a test circuit which contains the first inductor and further has a means for galvanically decoupling from a ground connection.

2. The method as claimed in claim 1, wherein during the testing of the transformer a fault is detected if a detected transmission behavior between the test voltage and the direct voltage differs from a predetermined transmission behavior between the test voltage and the direct voltage during fault-free operation of the transformer.

3. The method as claimed in claim 2, wherein the first inductor in the first circuit is additionally part of a test circuit which predefines the transmission behavior and has at least one resistor which connects the first inductor to a fixed potential by the direct voltage, and wherein the direct voltage and the test voltage are correspondingly applied to the test circuit and tapped in the test circuit.

4. A device for carrying out a method as claimed in claim 1.

5. A transformer, comprising:
    a first circuit with a first inductor,
    a second circuit with a second inductor which is galvanically isolated from the first inductor and is coupled to the first inductor,
    and
    a device as claimed in claim 4.

6. The transformer as claimed in claim 5, wherein the test circuit further contains at least two resistors for applying the direct voltage and tapping the test voltage.

7. The transformer as claimed in claim 6, wherein the resistors form a voltage divider, and the first inductor is connected in series between the two resistors.

8. The transformer as claimed in claim 7, wherein a first of the two resistors is arranged opposite a ground connection when viewed from the first inductor, and a transformer tap is arranged between the first resistor and the first inductor.

9. The transformer as claimed in claim 8, wherein the first resistor has high impedance.

10. The transformer as claimed in claim 9, wherein a second of the two resistors is connected in series with a voltage source in order to output the direct voltage parallel with the means for galvanically decoupling.

11. The transformer as claimed in claim 6, wherein means for galvanically decoupling is a capacitor.

12. The transformer as claimed in claim 8, wherein a second of the two resistors is connected in series with a voltage source in order to output the direct voltage parallel with the means for galvanically decoupling.

* * * * *